(12) United States Patent
Kaneko et al.

(10) Patent No.: US 11,775,205 B2
(45) Date of Patent: Oct. 3, 2023

(54) SEMICONDUCTOR STORAGE DEVICE AND READING METHOD

(71) Applicant: Winbond Electronics Corp., Taichung (TW)

(72) Inventors: Fujimi Kaneko, Kanagawa (JP); Makoto Senoo, Kanagawa (JP); Takamichi Kasai, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/876,529

(22) Filed: Jul. 28, 2022

(65) Prior Publication Data

US 2023/0064419 A1 Mar. 2, 2023

(30) Foreign Application Priority Data

Aug. 31, 2021 (JP) ................................. 2021-140691

(51) Int. Cl.
*G06F 11/10* (2006.01)
*H03M 13/29* (2006.01)
*G11C 29/52* (2006.01)
*H03M 13/35* (2006.01)
*G11C 29/00* (2006.01)
*G11C 29/44* (2006.01)
(Continued)

(52) U.S. Cl.
CPC .......... *G06F 3/0655* (2013.01); *G06F 3/0619* (2013.01); *G06F 3/0679* (2013.01); *G06F 11/0727* (2013.01)

(58) Field of Classification Search
CPC .. G06F 3/0655; G06F 11/0727; G06F 3/0619; G06F 3/0679
See application file for complete search history.

(56) References Cited

U.S. PATENT DOCUMENTS 6,510,537 B1 * 1/2003 Lee ..................... G06F 11/1008
714/763
10,102,061 B2 10/2018 Authement et al.
(Continued)

FOREIGN PATENT DOCUMENTS

CN 103578535 2/2014
CN 110727398 1/2020
(Continued)

OTHER PUBLICATIONS

"Office Action of Taiwan Counterpart Application", dated Jan. 10, 2023, p. 1-p. 8.

*Primary Examiner* — Guy J Lamarre
(74) *Attorney, Agent, or Firm* — JCIPRNET

(57) ABSTRACT

The disclosure provides a semiconductor storage device and a reading method that can achieve high-speed processing of error detection and correction and miniaturization. The flash memory of the disclosure has a NAND chip and an ECC chip. The NAND chip includes a memory array, and a page buffer/sensing circuit including a latch (L1) and a latch (L2). The ECC chip includes RAM_E and RAM_O. The RAM_E and RAM_O hold the read data output from the latches (L1, L2) of the NAND chip. RAM_E holds the data of the even-numbered sectors, and RAM_O holds the data of the odd-numbered sectors. Making RAM_E or RAM_O alternately hold the data of the sectors can reduce the data size of RAM_E and RAM_O.

13 Claims, 10 Drawing Sheets

(51) Int. Cl.
*H04L 9/40* (2022.01)
*G06F 3/06* (2006.01)
*G06F 11/07* (2006.01)

(56) References Cited

U.S. PATENT DOCUMENTS

| | | |
|---|---|---|
| 10,621,091 B2 | 4/2020 | Mondello et al. |
| 2004/0205440 A1* | 10/2004 | Kojima .............. G11B 20/1833 |
| | | 714/752 |
| 2017/0075757 A1* | 3/2017 | Im ........................ G06F 11/1068 |
| 2018/0074952 A1* | 3/2018 | Sudo ..................... G06F 12/126 |
| 2018/0253347 A1* | 9/2018 | Shigeta ................. G06F 11/073 |
| 2020/0133874 A1 | 4/2020 | Christensen et al. |

FOREIGN PATENT DOCUMENTS

| | | |
|---|---|---|
| CN | 107527647 | 4/2021 |
| TW | I685113 | 2/2020 |
| TW | I696077 | 6/2020 |

\* cited by examiner

SEMICONDUCTOR STORAGE DEVICE AND READING METHOD

CROSS-REFERENCE TO RELATED APPLICATION

This application claims the priority benefit of Japan application serial no. 2021-140691, filed on Aug. 31, 2021. The entirety of the above-mentioned patent application is hereby incorporated by reference herein and made a part of this specification.

BACKGROUND

Field of the Disclosure

The present disclosure relates to a semiconductor storage device such as a Not AND (NAND)-type flash memory, and particularly to error detection and correction.

Description of Related Art

In a NAND-type flash memory, sometimes the repetition of programming or erasing of data results in deterioration of a tunnel insulating film, etc., which causes poor charge retention characteristics, or a threshold variation is occurred due to charges trapped in the tunnel insulating film, and bit error takes place as a result. As a countermeasure against such a bit error, an error checking and correcting circuit (hereinafter referred to as an ECC circuit) may be used in the flash memory.

SUMMARY

FIG. 1 is a diagram showing a configuration of a conventional off-chip ECC flash memory. The flash memory 10 is formed by including a NAND chip 20. The NAND chip 20 includes a NAND-type memory array or a peripheral circuit thereof, and the NAND chip 20 is connected to a controller chip 30 having an ECC function 40 mounted thereon. The NAND chip 20 and the controller chip 30 are respectively accommodated in different packages, and each package is packaged, for example, on a printed substrate.

For example, the NAND chip 20 and the controller chip 30 are equipped with a Serial Peripheral Interface (SPI) capable of transmitting data synchronously with a clock signal. The two chips are respectively provided with input and output (I/O) terminals of #CS, CLK, DI, DO, #WP, and #HOLD. The controller chip 30 sends commands, addresses, and data to the NAND chip 20 through the I/O terminals of the SPI.

The ECC function 40 includes: an encoder that encodes data and generates parity data; and a decoder that decodes the data based on the parity data. The ECC function 40 performs multi-bit (e.g., 2-bit, 4-bit, 8-bit, etc.) error detection and correction through, for example, BCH (Bose Chaudhuri Hocquenghem) code. Under the circumstances, the BCH decoder includes: a syndrome calculation portion which evaluates the syndrome of data; an Euclidean algorithm calculation portion which calculates the error location polynomial (ELP); an error location search portion which calculates the roots of the ELP and finds the error location; and an error correction portion which corrects errors based on the found error location.

The page buffer/sensing circuit of the NAND chip 20 includes two latches, one latch includes two caches, and one cache stores data of multiple sectors (e.g., 2 sectors, 4 sectors etc.). Data transmission between the NAND chip 20 and the controller chip 30 is performed in unit of cache. Furthermore, the ECC function 40 generates parity data on a sector-by-sector basis, or performs error detection and correction. A sector encoded by the ECC function 40 contains main data and parity data.

When the controller chip 30 makes the NAND chip 20 to perform the programming operation, the ECC function 40 generates parity data according to the data to be programmed, and transmits the generated parity data and the main data to the NAND chip 20 through the DO terminal of the SPI. The NAND chip 20 holds the received main data and parity data in the latch, and programs the data held in the latch to a selected page of the memory array.

On the other hand, the data read from the memory array in the NAND chip 20 is transmitted to the controller chip 30 through the DO terminal of the SPI. The ECC function 40 detects errors based on the parity data, and corrects the main data or the parity data according to the detection results.

FIG. 2 is a timing chart showing the operation of each portion of the ECC function of the controller chip 30. The NAND chip 20 performs a read operation according to a read command transmitted from the controller chip 30, and outputs the read data to the controller chip 30. At time t0, the NAND_IF of the controller chip 30 starts to receive the main data and the parity data Pt of the sector S0 from the NAND chip 20, starts to receive the main data and the parity data Pt of the sector S1 at time t1, and starts to receive the main data and parity data Pt of the sector S2 and the sector S3 at time t2 and time t3. The ECC function 40 performs the calculation of the syndrome of the main data of the sector S0, the calculation of the ELP, and the search of the error location in the form of pipeline processing while the data of the sector S1 is being received, and corrects errors in the main data of the sector S0 based on the found error locations. Then, the CPU_IF of the controller chip 30 transmits the error-corrected data of the sector S0 to the host device. Regarding the ECC processing of the sector S1, the sector S2, and the sector S3, pipeline processing is performed in the same manner, and the error-corrected data of each sector is output during reception of the sector.

In the case of transmitting read data from the NAND chip 20 to the controller chip 30, the syndrome calculation must be performed after transmitting the parity data of the sector. Therefore, the following problem is inevitable, that is, if the bit width of the DO terminal of the SPI is narrow, data transmission takes time, the idle state of the controller chip 30 becomes longer during this period, and the performance of pipeline processing cannot be fully output. In addition, when the size of one page increases with the high integration of memory arrays, the area occupied by the page buffer/sensing circuit increases, resulting in an increase in the size of the chip. Therefore, it is desired to save the space of the page buffer/sensing circuit.

The semiconductor storage device of the present disclosure includes: a NAND chip including a NAND-type memory array, a control member, and an output member, the control member controls the read operation of the memory array, the output member outputs the data read from the memory array to the ECC chip; and an ECC chip including a first holding portion and a second holding portion, and an ECC member, the ECC member performs error detection and correction of the data held in the first holding portion and the second holding portion. When a page includes n sectors, the output member outputs data to the ECC chip in units of sectors. The first holding portion holds the data of the even-numbered sectors, and the second holding portion holds the data of the odd-numbered sectors. The ECC member performs error detection and correction of the data read from the first holding portion or the second holding portion.

The reading method of the present disclosure is a reading method of a semiconductor storage device. The semiconductor storage device includes a NAND chip including a NAND-type memory array, a control member, and an output member, the control member controls the read operation of the memory array, the output member outputs the data read from the memory array to the ECC chip; and an ECC chip including a first holding portion and a second holding portion, and an ECC member, the ECC member performs error detection and correction of the data held in the first holding portion and the second holding portion, and the output member outputs data to the ECC chip in units of sectors. The first holding portion holds the data of the even-numbered sectors, and the second holding portion holds the data of the odd-numbered sectors. The ECC member performs error detection and correction of the data read from the first holding portion or the second holding portion, and outputs the corrected data to the outside.

According to the present disclosure, the data size of the first holding portion and the second holding portion may be reduced by making the first holding portion and the second holding portion of the ECC chip to alternately hold the data of the even-numbered and odd-numbered sectors, thereby reducing the chip area and cost of the ECC chip. Furthermore, by setting the ECC chip separately from the NAND chip, the processing speed of error detection and correction may be increased.

Figure 4:
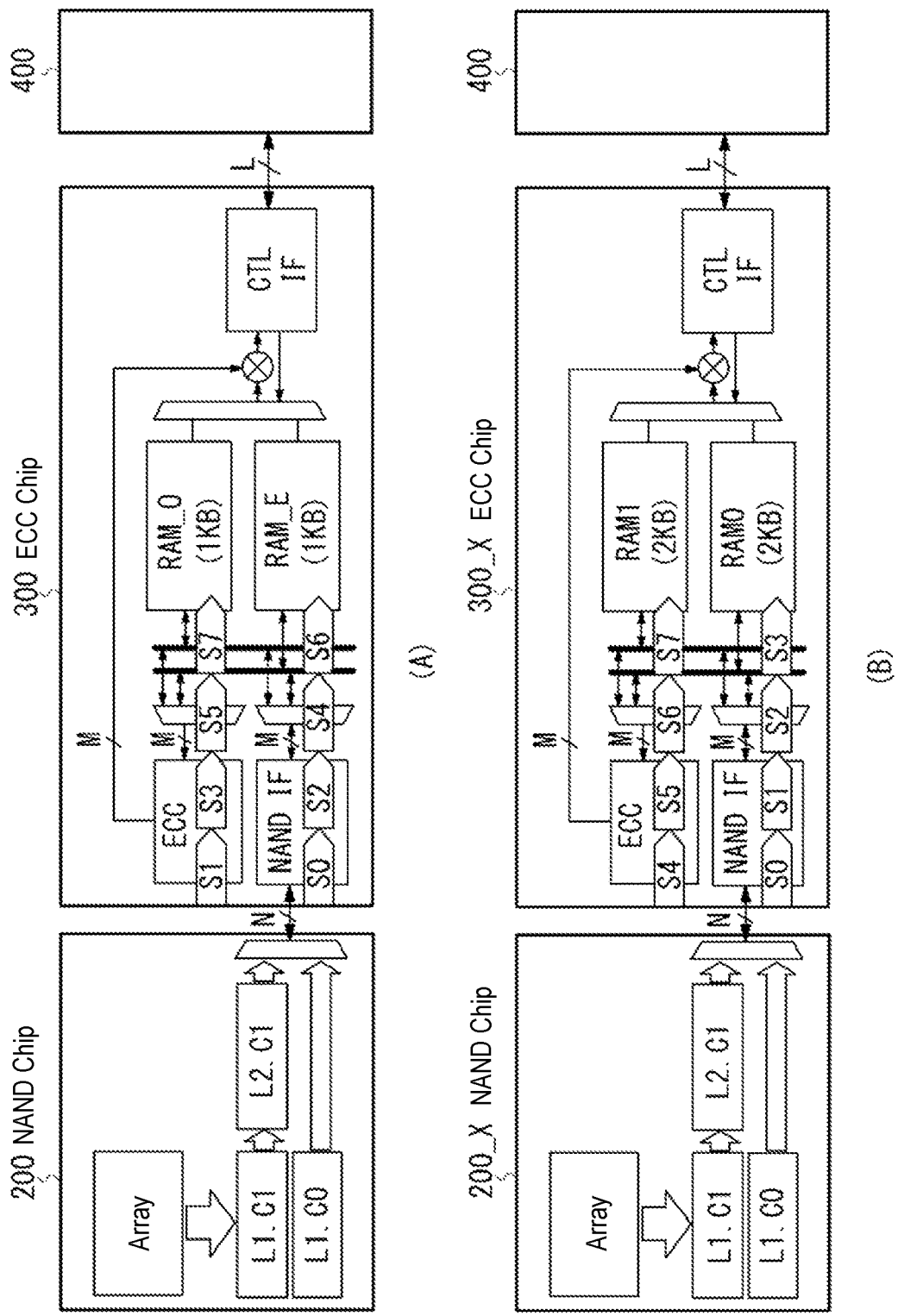

(A) of FIG. 4 is a diagram showing a configuration of a main portion of a flash memory according to the present embodiment, and (B) of FIG. 4 is a diagram showing a configuration of a main portion of a flash memory as a comparative example.

Figure 5:
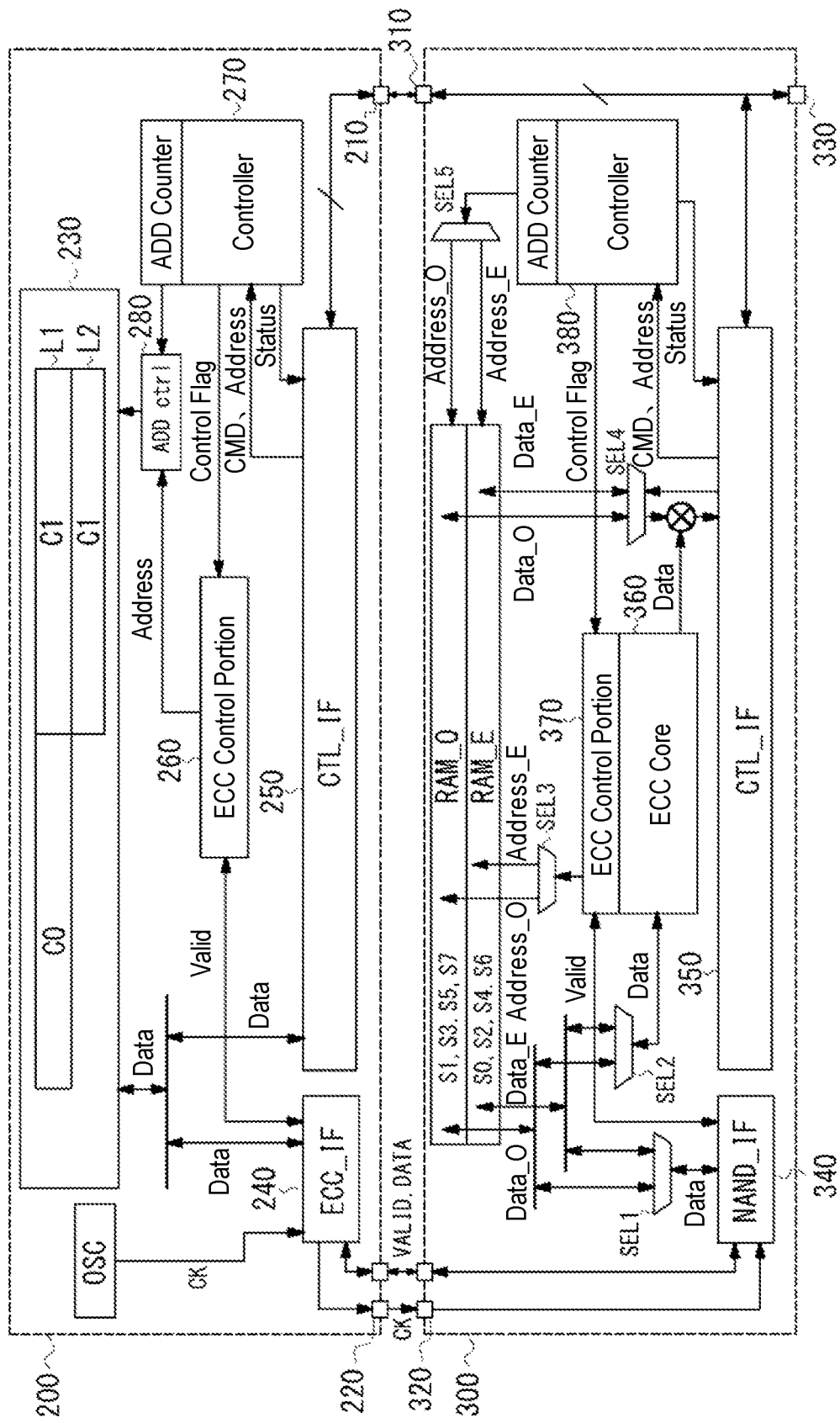

FIG. 5 is a block diagram showing an internal structure of a NAND chip and an ECC chip according to an embodiment of the present disclosure.

Figure 6:
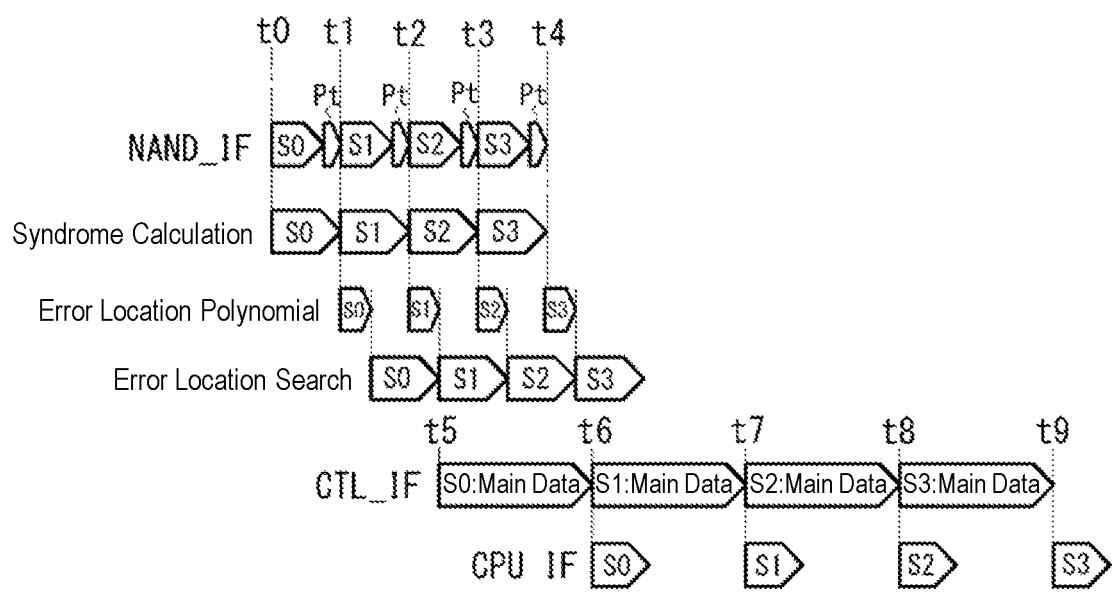

FIG. 6 is a timing chart showing an ECC operation of a flash memory according to an embodiment of the present disclosure.

Figure 7:
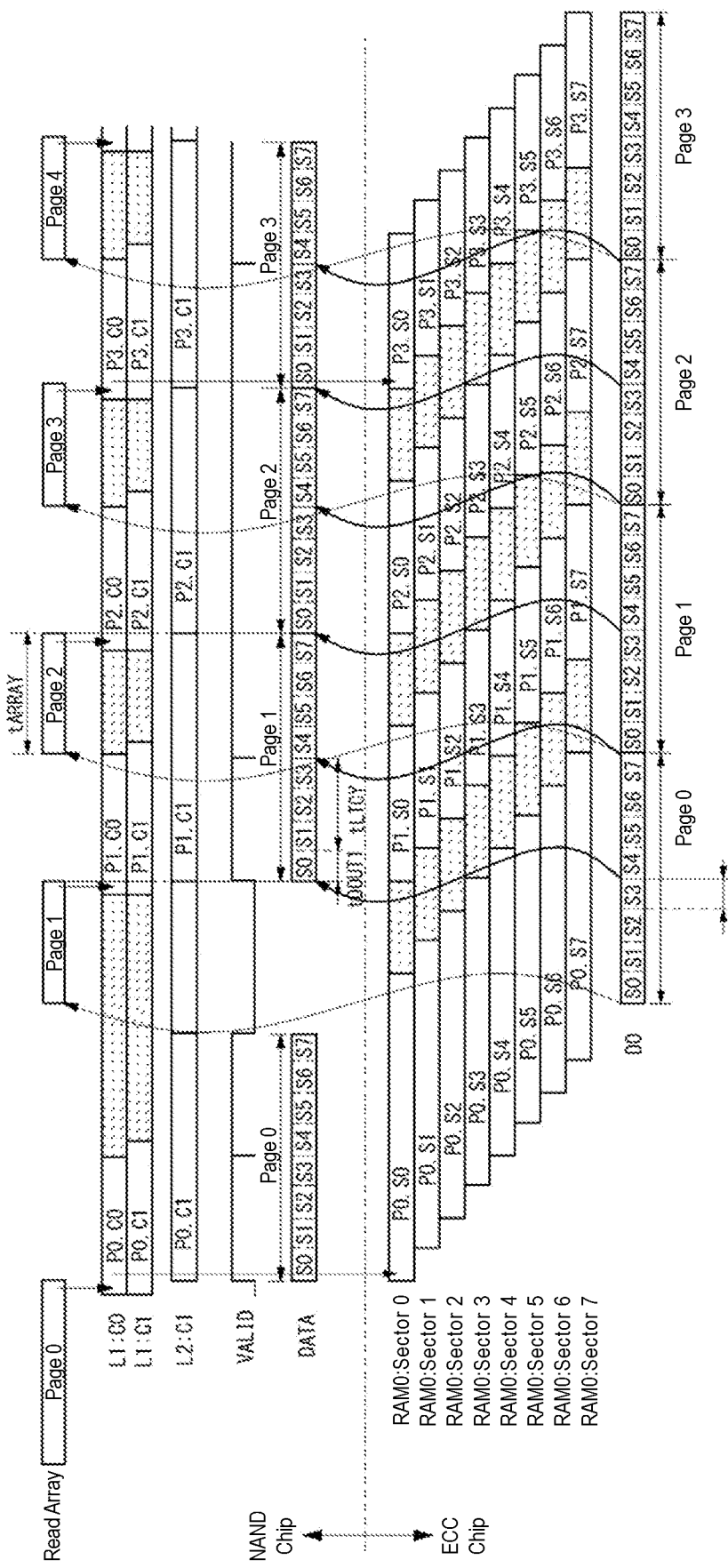

FIG. 7 is a diagram showing a timing chart of a continuous read operation of a flash memory according to a comparative example.

Figure 8:
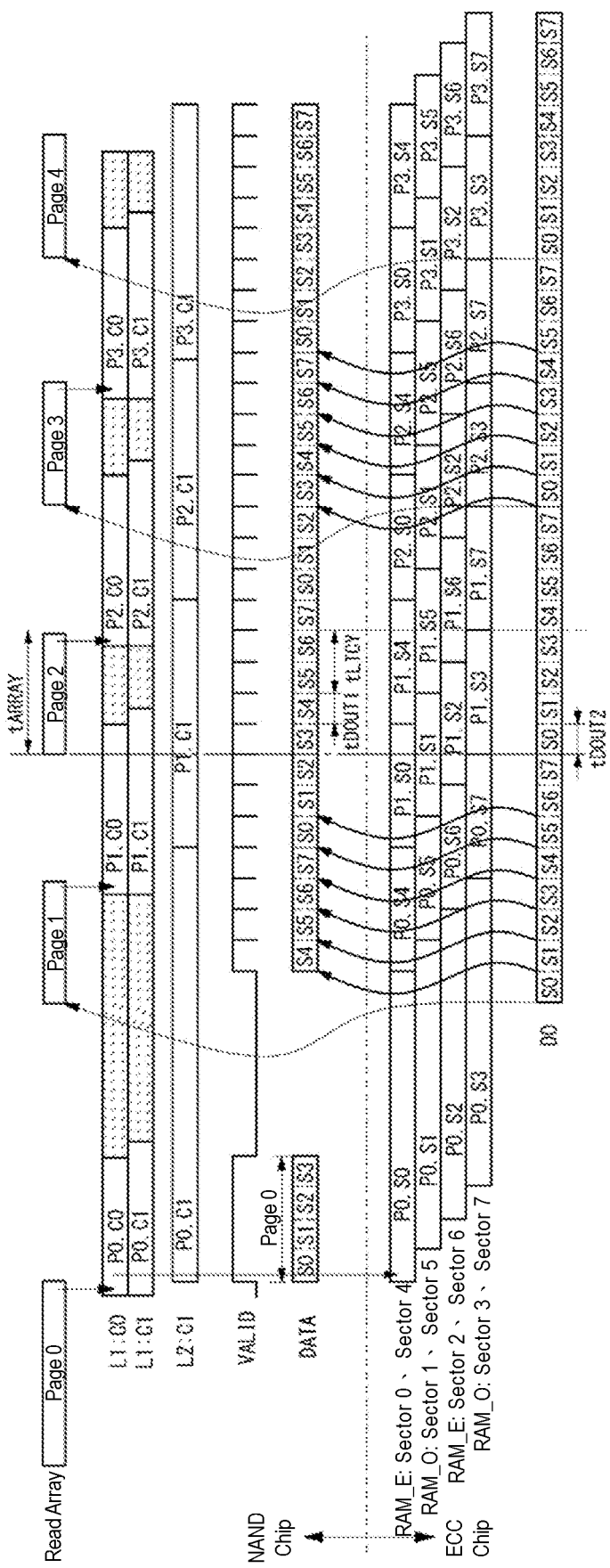

FIG. 8 is a diagram showing a timing chart of a continuous read operation of a flash memory according to an embodiment of the present disclosure.

Figure 9:
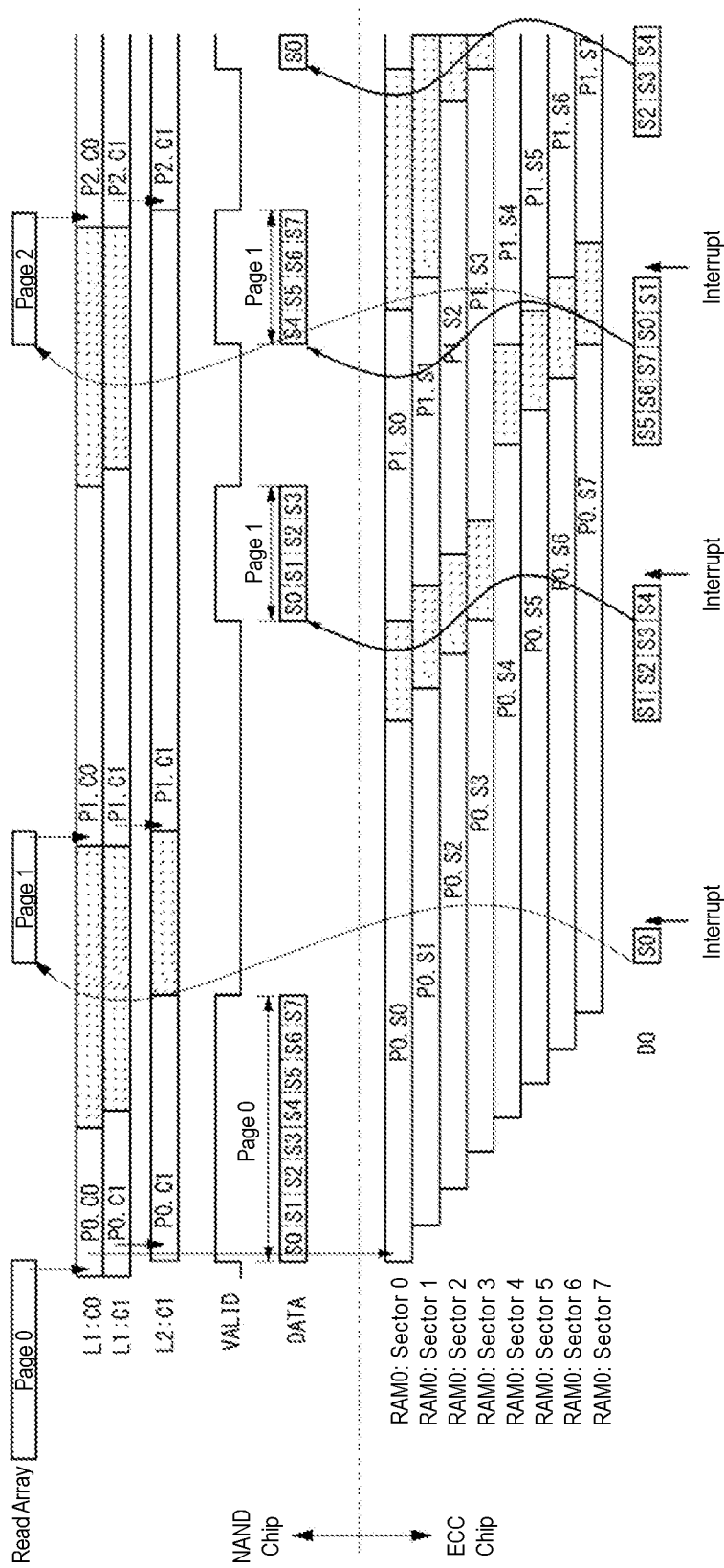

FIG. 9 is a diagram showing a timing chart when an interruption occurs in a continuous read operation in a flash memory of a comparative example.

Figure 10:
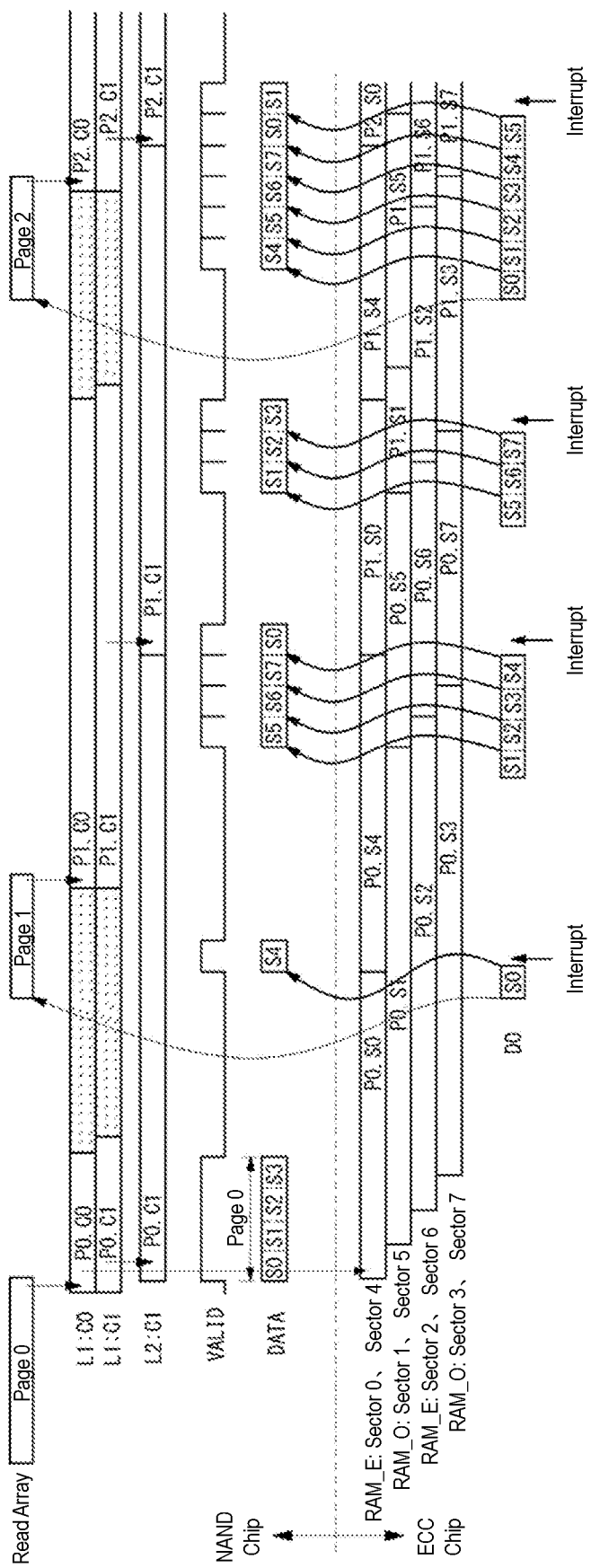

FIG. 10 is a diagram showing a timing chart when an interruption occurs in a continuous read operation in a flash memory of the present embodiment.

Figure 11:
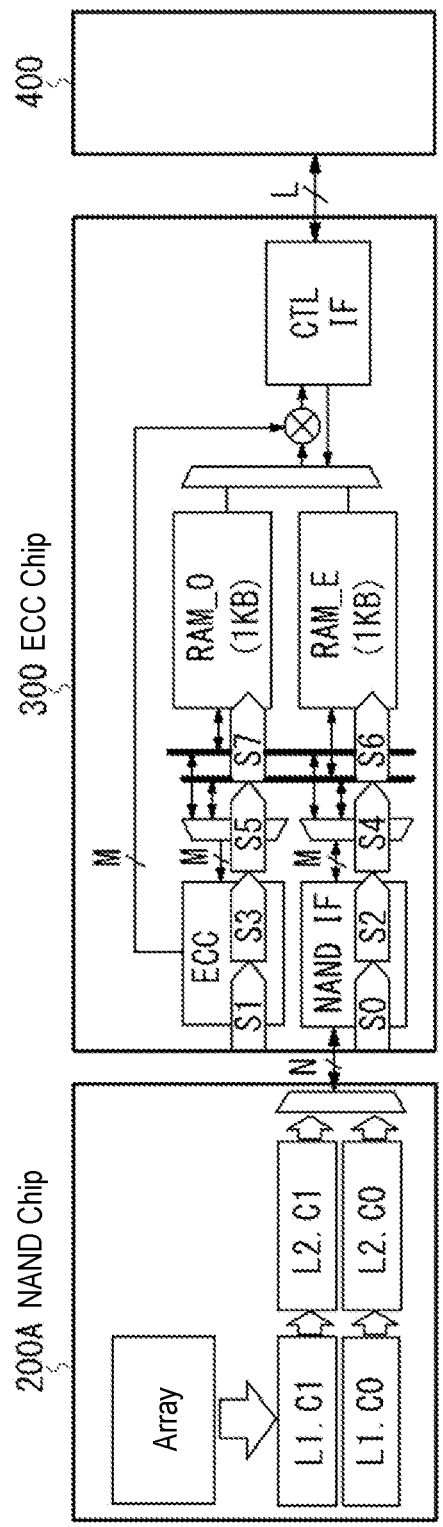

FIG. 11 is a diagram showing a configuration of a main portion of a flash memory according to a modification of the present disclosure.

DETAILED DESCRIPTION OF DISCLOSED EMBODIMENTS

Figure 1:
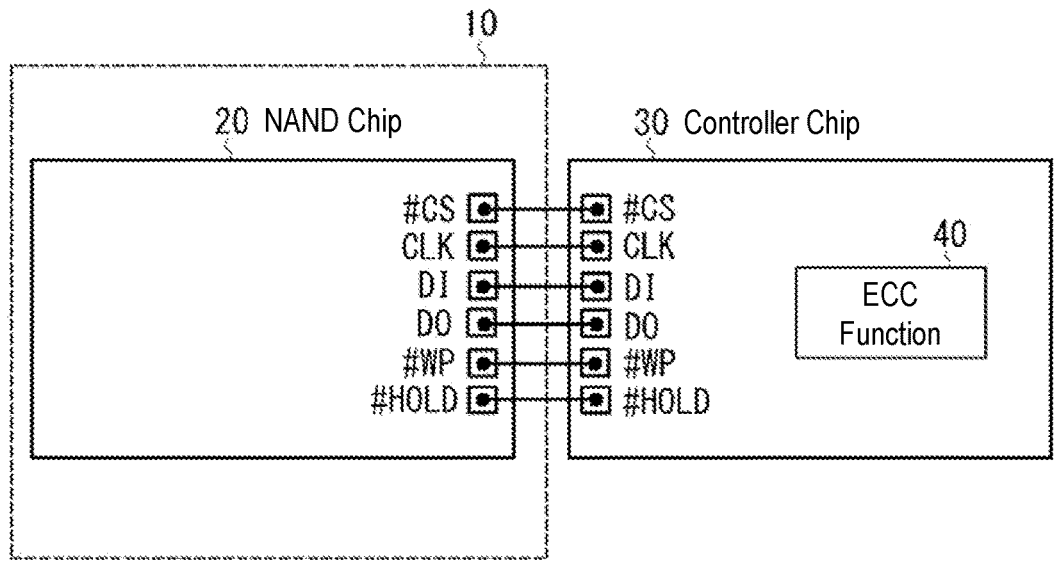
FIG. 1 is a diagram showing a schematic configuration of a conventional flash memory.
Figure 2:
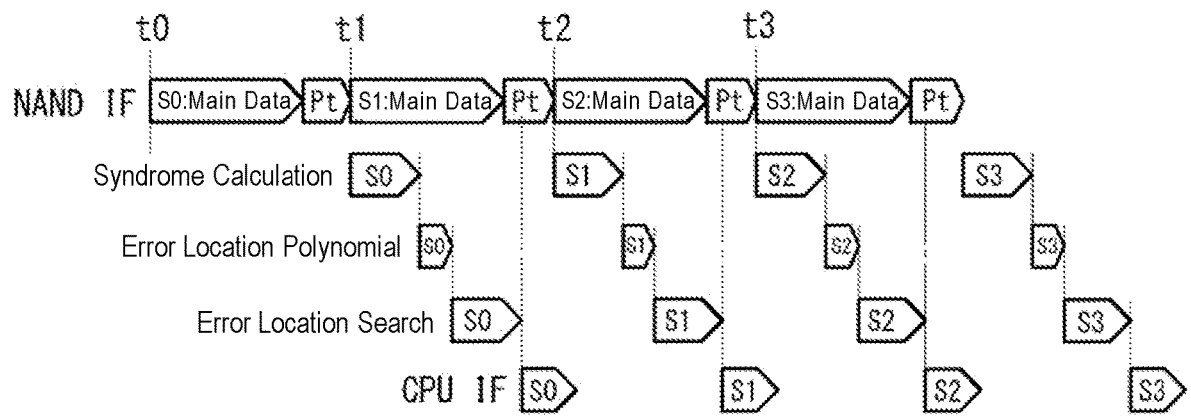
FIG. 2 is a timing chart showing an operation of an ECC function of a conventional flash memory.
Figure 3:
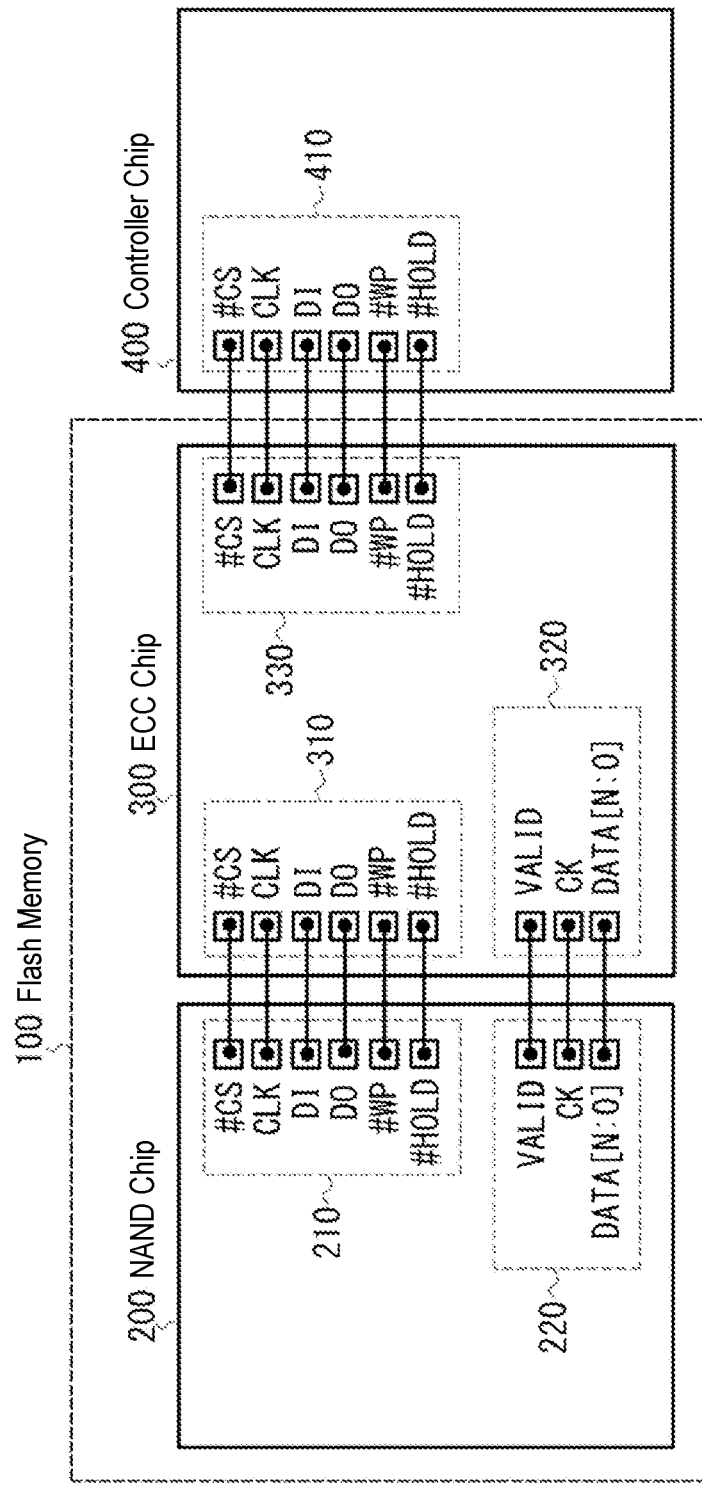
FIG. 3 is a diagram showing a schematic configuration of a flash memory according to an embodiment of the present disclosure.

FIG. 3 is a diagram showing a schematic configuration of a flash memory according to a first embodiment of the present disclosure. The flash memory 100 of this embodiment is formed by including a NAND chip 200 and an ECC chip 300 that is electrically connected to the NAND chip 200.

Although not shown here, the NAND chip 200 typically includes a NAND-type memory array and a peripheral circuit. The peripheral circuit includes a row decoder, a column decoder, a page buffer/sensing circuit, an interface circuit, a controller, an internal voltage generating circuit, etc. The controller controls read, program, and delete operations according to input commands. The memory array includes a plurality of blocks, and a plurality of NAND strings are formed in each block. The NAND strings may be formed two-dimensionally on the surface of a substrate or three-dimensionally on the surface of a substrate. A memory cell may be a single-level cell (SLC) type that stores one bit (binary data), or a type that stores multiple bits.

The NAND chip 200 includes an I/O (input and output) terminal 210 (#CS, CLK, DI, DO, #WP, #HOLD) for SPI and an I/O terminal 220 (VALID, CK, DATA) dedicated to ECC as the interface with the ECC chip 300. "#" means low active. #CS is a terminal for receiving a chip select signal used to enable or disable the chip, CLK is a terminal for receiving a serial clock signal, DI is a terminal for inputting a serial data, DO is a terminal for outputting a serial data, #WP is a terminal for receiving a signal for protecting the state register from being written, and #HOLD is a terminal for receiving a signal for holding the chip. The NAND chip 200 receives commands, addresses, and data in synchronization with the serial clock signal CLK, or outputs data in synchronization with the serial clock signal CLK through the I/O terminal 210 for SPI.

As the I/O terminal 220 dedicated to ECC, VALID is a terminal for inputting and outputting a VALID signal. The VALID signal indicates whether the data transmission between the NAND chip 200 and the ECC chip 300 is valid, and CK is a terminal of the clock signal CK used for output data transmission and ECC processing, DATA is a terminal for inputting and outputting data between the NAND chip 200 and the ECC chip 300. It should be noted here that the bit width m (data transmission width) of the DO terminal/DI terminal for SPI is, for example, ×1, ×4, or ×8, but the bit width n of the DATA terminal dedicated to ECC is configured to be relatively large than the bit width m of the DO terminal/DI terminal for SPI (n>m), for example, the bit width n is ×32. Therefore, if the frequencies of the clock signal CK and the clock signal CLK are the same, the data transmission time between the NAND chip 200 and the ECC chip 300 is n/m times faster than the data transmission time based on the SPI.

In addition, although not shown here, the NAND chip 200 may also include an ONFi interface in addition to the I/O terminal 210 for SPI. The ONFi interface includes external control terminals such as Command Latch Enable (CLE), Address Latch Enable (ALE), Write Enable (#WE), etc., and I/O terminals such as I/O etc.

The ECC chip 300 includes an I/O terminal 310 (#CS, CLK, DI, DO, #WP, #HOLD) for SPI and an I/O terminal 320 (VALID, CK, DATA) dedicated to ECC as the interface with the NAND chip 200. The I/O terminal 310 for SPI of the ECC chip 300 is respectively electrically coupled to the corresponding terminals of the I/O terminal 210 for SPI of the NAND chip 200, and the I/O terminal 320 dedicated to ECC is respectively electrically coupled to the corresponding terminals of the I/O terminal 220 dedicated to ECC of the NAND chip 200.

The ECC chip 300 further includes an I/O terminal 330 for SPI (#CS, CLK, DI, DO, #WP, #HOLD) as an interface with the controller chip 400. The I/O terminal 330 is electrically coupled to the corresponding terminal of the I/O terminal 410 for SPI of the controller chip 400. Each terminal of the I/O terminal 310 (#CS, CLK, DI, DO, #WP, #HOLD) is respectively electrically coupled to each terminal of the I/O terminal 330 (#CS, CLK, DI, DO, #WP, #HOLD) through an internal wiring. That is, although the I/O terminal 310 and the I/O terminal 330 are physically separated from each other in order to realize the connection between the NAND chip 200 and the controller chip 400, the I/O terminal 310 and the I/O terminal 330 are electrically connected to each other for the NAND chip 200 and the controller chip 400 in terms of electrical properties. Such connection is equivalent to connecting the I/O terminal 210 for SPI of the NAND chip 200 to the I/O terminal 410 for SPI of the controller chip 400.

(A) of FIG. 4 is a diagram showing a configuration of a main portion of a flash memory according to the present embodiment, and (B) of FIG. 4 is a diagram showing a configuration of a main portion of a flash memory as a comparative example. The NAND chip 200, an NAND chip 200_X contain page buffer/sensing circuits that hold data read from the memory array or hold data for programming in the memory array. The page buffer/sensing circuit includes two-stage latch L1 and latch L2. The latch L1 includes a cache C0 and a cache C1, and the latch L2 includes a cache C1. The cache C1 of the latch L1 and the cache C1 of the latch L2 may perform bidirectional data transmission. The latch L1 holds one page of data (for example, 4 KB), the cache C0 and the cache C1 hold ½ page of data (for example, 2 KB), and the cache C0 holds data of four sectors from sector S0 to sector S3 (for example, one sector is 512 bytes), the cache C1 holds the data of four sectors from sector S4 to sector S7.

In the comparative example, when the continuous read operation of page is performed in the NAND chip 200_X, the data of the page read from the memory array is held in the cache C0 and C1 of the latch L1, and the data of the cache held in the latch L1 is transmitted to the cache C1 of the latch L2. Then, after the NAND chip 200_X transmits the data of the sectors S0 to S3 held in the cache C0 of the latch L1 to the ECC chip 300_X, the NAND chip 200_X transmits the data of the sectors S4 to S7 held in the cache C1 of the latch L2 to the ECC chip 300_X. The data transmission from the NAND chip 200_X to the ECC chip 300_X is performed in a units of cache (four sectors as a unit). If transmission of the ½ page of data performed by the NAND chip 300_X is completed, the next ½ page of data is transmitted.

The ECC chip 300_X includes random access memories RAM1 and RAM2 of a two-stage structure for holding data transmitted from the NAND chip 200_X. RAM1 and RAM2 respectively hold ½ page of data (for example, 2 KB), RAM1 saves the data of sectors S0 to S3 read from latch L1, RAM2 saves the data of sectors S4 to S7 read from latch L2.

The ECC chip 300_X performs error detection and correction on a sector-by-sector basis while receiving data from the NAND chip 200_X.

On the other hand, in the present embodiment, in the NAND chip 200, the page buffer/sensing circuit includes the latch L1 and the latch L2 configured in the same manner as in the comparative example, but the ECC chip 300 includes RAM_E and RAM_O with data size half of the data size of RAM0 and RAM1 in the comparative example. That is, RAM_E and RAM_O may store ¼ page of data, that is, data of two sectors.

The NAND chip 200 controls data transmission in units of sectors. First, the ½ page of data of the sectors S0 to S3 held in the cache C0 of the latch L1 is transmitted to the ECC chip 300. In response to the transmission, the ECC chip 300 stores the even-numbered sectors S0 and S2 in RAM_E, and stores the odd-numbered sectors S1 and S3 in RAM_O. Before the ECC chip 300 starts to transmit the next ½ pages of data in sectors S4 to S7, the ECC chip 300 performs error detection and correction on the data stored in the sectors S0 to S3 of the RAM_E and RAM_O. Then, the NAND chip 200 transmits the ½ page of data of the sectors S4 to S7 held in the cache C1 of the latch L2 to the ECC chip 300, and the ECC chip 300 stores the even-numbered sectors S4 and S6 in RAM_E, and stores the odd-numbered sectors S5 and S7 in RAM_O.

In response to the ECC chip 300 outputting the data at the initial address of the sector S0 to the controller chip 400, the NAND chip reads the next page from the memory array and holds the read data in the latch L1. When the data at the initial address of the sector S0 is output to the controller chip 400, the data of the cache C1 of the latch L1 is transmitted to the latch L2, so that the data of the next page may be overwritten in the latch L1.

In this embodiment, the data size (storage capacity) of the RAM_E and RAM_O of the ECC chip 300 may be reduced, thereby reducing the chip area and the cost of the ECC chip 300. Furthermore, by performing data transmission from the NAND chip 200 to the ECC chip 300 through a dedicated port, it is possible to achieve high-speed output of read data.

FIG. 5 is a block diagram showing an internal structure of a NAND chip 200 and an ECC chip 300. However, it should be noted that the structure related to the ECC operation is shown in the NAND chip 200, and not all structures are shown.

The NAND chip 200 includes: a page buffer/sensing circuit 230, including a latch L1 and a latch L2; an oscillator OSC, which generates a clock signal CK; an interface circuit (hereinafter referred to as ECC_IF) 240, which is configured to control the data transmission with the ECC chip 300 through the I/O terminal 220 dedicated to ECC; an interface circuit (hereinafter referred to as CTL_IF) 250, which is configured to control the data transmission with the controller chip 400 through the I/O terminal 210 for SPI; an ECC control portion 260; a controller 270, which receives commands and addresses input from the I/O terminal 210, includes a decoder for decoding commands or an address counter for holding and counting addresses, and controls various portions based on the decoding results of the commands; and an address control portion 280, which controls the column address of the page buffer/sensing circuit 230.

The latch L1 includes a cache C0 and a cache C1, and the latch L2 includes the cache C1 only. The latch L1 and the latch L2 may bidirectionally transmit the data of the cache C1. The latch L1 holds a page of data (for example, 4 KB), and the cache C0 and the cache C1 hold ½ page of data (for example, 2 KB). The cache C1 of latch L2 holds ½ page of data (e.g., 2 KB). The cache C0 holds the data of sector S0 to sector S3 (for example, one sector is 512 bytes), and the cache C1 holds the data of sector S4 to sector S7.

The oscillator OSC generates a clock signal CK, and the clock signal CK is a frequency that is most suitable for the data transmission time and the processing time of various portions of the ECC operation. Data transmission between the NAND chip 200 and the ECC chip 300 through the DATA terminal is performed in synchronization with the clock signal CK, and the ECC core 360 of the ECC chip 300 performs ECC processing in synchronization with the clock signal CK. The frequency of the clock signal CK is irrelevant with the frequency of the clock signal CLK of the SPI, and may be set to be higher than the frequency of the clock signal CLK.

The ECC_IF 240 receives the clock signal CK generated by the oscillator OSC, and provides the clock signal CK to the CK terminal of the ECC chip 300 through the CK terminal. During the read operation, the ECC_IF 240 outputs the read data held in the latch L2 from the DATA terminal to the DATA terminal of the ECC chip 300 at the timing synchronized with the clock signal CK, and when in programming operation, receives the parity data generated by the ECC chip 300 from the DATA terminal at the timing synchronized with the clock signal CK.

The ECC control portion 260 provides a VALID signal to the ECC_IF 240 during a read operation. The VALID signal specifies a period during which data transmission between the I/O terminal 220 dedicated to ECC and the I/O terminal 320 becomes valid, and data transmission in units of sector may be performed during said period. During the period specified by the VALID signal, the ECC_IF 240 transmits data from the DATA terminal of the NAND chip 200 to the DATA terminal of the ECC chip, for example, during the period when the VALID signal is high active. Moreover, the ECC_IF 240 outputs a VALID signal from the VALID terminal to the VALID terminal of the ECC chip 300, so that the NAND_IF 340 of the ECC chip 300 may receive data from the NAND chip 200.

The CTL_IF 250 controls the input and output of data through the I/O terminal 210. The CTL_IF 250 receives the command, address, and data output from the controller chip 400, provides the command and the address to the controller 270, and holds the data in the latch L2 or the latch L1.

The controller 270 decodes the input command, and controls operations such as reading, programming, and deletion based on the decoding result. Furthermore, the controller 270 provides the ECC control portion 260 with a control flag for identifying reading or programming based on the decoding result, or provides the CTL_IF 250 with a status signal indicating whether the NAND chip 200 is in a busy or standby state. The controller 270 includes an address counter that counts the column addresses input from the CTL_IF 250, and provides the address of the address counter to the address control portion 280.

The ECC control portion 260 includes logic for controlling the ECC processing, and an address counter for holding and counting addresses for the ECC processing. The ECC control portion 260 has the same configuration as the ECC control portion 370 of the ECC chip 300, that is, includes the ECC control portion 260 in synchronization with the ECC control portion 370, so that it is possible to identify which ECC operation is performed by the ECC chip 300. In addition, control flags are used for encoder or decoder switching performed by the ECC core 360.

The address control portion 280 receives the column address output from the controller 270 and the column address for ECC output from the ECC control portion 260, and provides the column address selected according to the operation of the NAND chip 200 to the page buffer/sensing circuit 230. The location of data read from the latch L2 or the location of data written to the latch L2 is controlled by the column address.

The ECC chip 300 includes: RAM_E and RAM_O; an interface circuit (hereinafter referred to as NAND_IF) 340, which controls data transmission with the NAND chip 200 through an I/O terminal 320 dedicated to ECC; an interface circuit (hereinafter, referred to as CTL_IF) 350, which controls the input and output of data between the NAND chip 200 and the controller chip 400 through the I/O terminal 330 and I/O terminal 310 for SPI; an ECC core 360, which performs error detection and correction; an ECC control portion 370, which includes logic for controlling the ECC core 360 and an address counter for holding and counting addresses for ECC processing; and a controller 380, which receives commands, addresses, and data input from the I/O terminal 310 and the I/O terminal 330.

It should be noted here that the ECC chip 300 is equipped with the controller 380 so as to identify what kind of operation the NAND chip 200 is performing. The controller 380, like the controller 270 of the NAND chip 200, receives the input commands and addresses, includes the decoder for decoding the command or the address counter for holding and counting the address. Furthermore, the I/O terminal 330 for SPI is electrically coupled to the corresponding terminal of the I/O terminal 310 for SPI, and provides commands, addresses, and data from the controller 400 to both the ECC chip 300 and the NAND chip 200.

RAM_E and RAM_O respectively hold ¼ page of data (data of two sectors). RAM_E may hold the data of sector S0, sector S2, sector S4 and sector S6 read from the cache C0 of the latch L1, RAM_O may hold the data of sector 1, sector S3, sector S5, and sector S7 read from the cache C1 of the latch L2. Unlike latch L1 and latch L2, RAM_E and RAM_O function as dual-port memory, and in contrast to latch L1 and latch L2 which contain asynchronous circuits, RAM_E and RAM_O contain synchronization circuits.

When the read operation is performed in the NAND chip 200, the NAND_IF 340 sequentially receives a page of data in units of sectors from the NAND chip 200 through the I/O terminal 220 and the I/O terminal 320 dedicated to the ECC during the period when the VALID signal is high active. The ECC control portion 370 selects data_E (sector S0, sector S2, sector S4, sector S6) or data_O (sector S1, sector S3, sector 5, sector 7) stored in RAM_E or RAM_O through a selector SEL1, and select address_E or address_O leading to RAM_E or RAM_O through a selector SEL3.

When the ECC core 360 performs error detection and correction of the read data, the ECC control portion 370 selects the address of RAM_E or RAM_O through a selector SEL3, and provides the same data as written to RAM_E or RAM_O to the ECC core 360 through the selector SEL2. Under the control of the ECC control portion 370, the ECC core 360 performs syndrome calculation, Euclidean algorithm calculation, and error location search in the form of pipeline processing. In order to correct the error according to the found error location, the error bits of the data read from RAM_E or RAM_O selected by a selector SEL4 are reversed, and the corrected data is output to the controller chip 400 via the I/O terminal 330 through the CTL_IF 350.

Furthermore, when the programming operation is performed, commands, addresses, and data from the controller chip 400 are input to the ECC chip 300 in addition to the NAND chip 200. The controller 380 identifies the programming operation based on the decoding result of the command, and stores the data input from the I/O terminal 330 for SPI in RAM_E and RAM_O. The ECC control portion 370 identifies the programming operation through the control flag from the controller 380, and makes the encoder of the ECC core 360 run.

Under the control of the ECC control portion 370, the ECC core 360 reads the input data held in RAM_E or RAM_O, encodes the read data in unit of sectors, and generates parity data for various sectors. The generated parity data is transmitted from the DATA terminal to the DATA terminal of the NAND chip 200 via the NAND_IF 340. The NAND chip 200 holds the data received from the controller chip 400 in the latch L1, and holds the parity data of various sectors received from the ECC chip 300 via the ECC_IF 240 in the latch L1 according to the column address designated by the ECC control portion 260. Then, the controller 270 programs the data held in the latch L1 to the memory array.

Next, the details of the ECC operation of the flash memory 100 of the present embodiment will be described. FIG. 6 is a timing chart showing the decoding of the read data by the ECC core 360. When the NAND chip 200 performs the read operation according to the read command, at time t0, the ECC_IF 240 of the NAND chip 200 transmits the main data and the parity data Pt of the sector S0 held in the latch L1 from the DATA terminal in synchronization with the clock signal CK. The NAND_IF 340 of the ECC chip 300 starts to receive the main data and the parity data Pt of the sector S0 from the DATA terminal, and the reception of the main data and the parity data Pt of the sector S0 ends at time t1. The received data of the sector S0 is stored in the RAM_E, and at the same time, the ECC core 360 performs the syndrome calculation of the sector S0. Regarding the transmission time between time t0 and time t1, since the data width of the DATA terminal dedicated to ECC and the frequency of the clock signal CK have been optimized for ECC processing, the data transmission time may be shorter than the transmission time in the case using the I/O terminal 210 for SPI.

Similarly, the transmission of the main data and the parity data Pt of the sector S1 at time t2 is completed, and the data of sector S1 is stored in RAM_O. The transmission of the main data and the parity data Pt of the sector S2 at time t3 is completed, and the data of sector S2 is stored in RAM_E. The transmission of the main data and the parity data Pt of the sector S3 at time t4 is completed, and the data of sector S3 is stored in RAM_O.

While saving the data of sector S0 to RAM_E, the ECC core 360 begins to calculate the syndrome of sector S0. However, in an embodiment, the bit width of the DATA terminal or the frequency of the clock signal CK is set in such a way that the syndrome calculation of the sector S0 ends at time t1. After calculating the syndrome, the ECC core 360 performs ELP calculation and error location search for sector S0 during reception of the data of sector S1.

At time t5, the ECC core 360 reads the main data of the sector S0 from the RAM_E selected by the selectors SEL4 and SEL5 in synchronization with the clock signal CLK, uses ExOR to reverse the bit error of the main data of the sector S0, and outputs the main data of the error-corrected sector S0 from the DO terminal of the I/O terminal 330 to the controller chip 400 in synchronization with the clock signal CLK for SPI. The ECC core 360 performs error correction of sector S1, sector S2, and sector S3 at time t6, time t7, and time t8, and sequentially outputs the main data of the error-corrected sector S1, the sector S2, and the sector S3 to the controller chip 400 through the I/O terminal 330. The CPU_IF of the controller chip 400 transmits the main data of the sector S0, the sector S1, the sector S2, and the sector S3 received at the time t6, the time t7, the time t8, and the time t9 to the host device.

While the ECC core 360 performs the processing after the ELP calculation of the sectors S0 to S3, the NAND chip 200 transmits the main data and the parity data of the sectors S4 to S7 to the ECC chip 300 through the I/O terminal 220 dedicated to ECC. The data transmission of the sectors S4 to S7 is performed in response to the timing of outputting the sectors S0 to S3 to the outside. That is, RAM_E and RAM_O may respectively hold only ¼ page (two sectors) of data, so after outputting the held data, the data in RAM_E and RAM_O may be overwritten.

Next, the continuous read operation of the pages of the flash memory according to the present embodiment will be described. FIG. 7 is a timing chart of the continuous read operation of the flash memory (RAM0 and RAM1 each have a size (2 KB) for storing ½ page of data) of the comparative example shown in (B) of FIG. 4. FIG. 8 is a timing chart of the continuous read operation of the flash memory (RAM_E and RAM_O each have a size (1 KB) for storing ¼ page of data) of the present embodiment.

In FIG. 7 and FIG. 8, the upper half shows the operation of the NAND chip 200, and the lower half shows the timing of the ECC chip 300. In the flash memory of the comparative example, as shown in FIG. 7, reading array from the memory array is performed in response to the data of the initial address of the page output from the DO terminal of the ECC chip 300. For example, when the data of the initial address of the sector S0 of the page P0 is output from the terminal DO, the NAND chip 200 starts to read the array of the page P1.

The NAND chip 200 holds the data of the page read from the memory array in the cache C0 and the cache C1 of the latch L1, and then transmits the data of sector S4 to sector S7 of the cache C1 of the latch L1 to the cache C1 of the latch L2. During the period when the VALID signal is high active, the data of the sectors S0 to S3 of the cache C0 held in the latch L1, and the data of the sectors S4 to S7 of the cache C1 held in the latch L2 are transmitted as a page of data to the ECC chip 300 in units of cache. The timing of transmitting data from the NAND chip 200 to the ECC chip 300 becomes the timing when the ECC chip 300 outputs the data of the final address in units of cache to the controller chip 400. For example, in response to the ECC chip 300 outputting the data of the final address of sector S3 of page P0, the NAND chip 200 starts to transmit the data of sectors S0 to S3 of page P1.

The ECC chip 300 performs error detection and correction on a sector-by-sector basis, and then outputs corrected data from the DO terminal. If the ECC chip 300 outputs the data of the initial address of the page, the NAND chip 200 starts to read the array of the next page, and holds the read data in the latch L1. When the array of the next page starts to be read, the data of the cache C1 in the latch L1 is transmitted to the latch L2, so there will be no problem even if the data of the next page is overwritten in the latch L1.

The address counter of the controller 270 of the NAND chip 200 is synchronized with the address counter of the controller 380 of the ECC chip 300, and the controller 270 of the NAND chip 200 may use the column address counted by the address counter to acquire the initial address of the page output from the DO terminal of the ECC chip 300 or the final address of the cache. The address counter increments the column address by counting the number of toggles of the clock signal CK.

In the flash memory of the present embodiment, as shown in FIG. 8, the timing of reading the memory array is the same as that of the comparative example, that is, reading is performed in response to outputting the data of the initial address of the page from the DO terminal of the ECC chip 300. Moreover, regarding the data transmission between the NAND chip 200 and the ECC chip 300, the comparative example is performed in units of caches, whereas the present embodiment is performed in units of sectors. If data of one sector is transmitted, the VALID signal transitions to high active during the data transmission period of one sector. In response to the ECC chip 300 completing the data output of the sector, the NAND chip 200 transmits the ½ page of data of the sector from the sector to the ECC chip 300. For example, if the ECC chip 300 completes the output of the data of the sector S0, the NAND chip 200 transmits the data of the sector S4 of the same page to the ECC chip 300, and if the ECC chip 300 completes the output of the data of the sector S1, the same page of data of the sector S5 is transmitted to the ECC chip 300. After the data output of the sector S0 is completed, the next sector S4 may be overwritten in the RAM_E, and after the data output of the sector S1 is completed, the next sector S5 may be overwritten in the RAM_O.

Next, the limitation in performing continuous reading from the flash memory of the present embodiment is described. Here, the time for the NAND chip 200 to output data of one sector is set as tDOUT1, the time for the ECC chip 300 to output data of one sector is set as tDOUT2, and the latency from outputting the data of one sector from the NAND chip 200 to the end of error detection and correction of said sector is set as tLTCY.

In the comparative example, the equation (1) becomes a limitation.

$$tDOUT1 + tLTCY < tDOUT2 \times 4 \quad (1)$$

In contrast, in the present embodiment, equation (2) becomes a limitation.

$$tDOUT1 + tLTCY < tDOUT2 \times 3 \quad (2)$$

The NAND chip 200 and the ECC chip 300 are connected by I/O terminals dedicated to ECC. If a sector is 512 bytes, the bit width of the dedicated DATA terminal is set to 16 bits, and the frequency of the clock signal CK is set to 80 MHz, then tDOUT1=4 µs, tLTCY=4 µs. Under the circumstances, tDOUT2>(4+4)/3=2.7 µs.

FIG. 9 is a diagram showing a timing chart when an interruption occurs in a continuous read operation in a flash memory of a comparative example. FIG. 10 is a diagram showing a timing chart when an interruption occurs in a continuous read operation in a flash memory of the present embodiment. For example, sometimes the clock signal CLK of the ECC chip 300 is stopped and so on, which results in interruption of data output from the DO terminal during continuous reading (the interruption is shown at the DO terminal). In the case of such an interruption, in the flash memory of the present embodiment, the RAM_E and RAM_O of the ECC chip 300 hold the data transmitted from the NAND chip 200. Moreover, before the ECC chip 300 outputs the data at the initial address of the page, the array of the next page is not read. Therefore, the data of the previous page is held in latch L1 and latch L2. Accordingly, data will not be lost due to interruption, and the NAND chip 200 and the ECC chip 300 share the address of the page being read, so that continuous reading may be resumed after interruption.

FIG. 11 is a diagram showing a configuration of a main portion of a flash memory according to a modification of the present disclosure. In the above embodiment, as shown in (A) of FIG. 4, the NAND chip 200 includes the latch L1 including the cache C0 and the cache C1, and the latch L2 including the cache C1. However, in this modification example, as shown in FIG. 11, the NAND chip 200A includes a latch L1 including a cache C0 and a cache C1, and a latch L2 including a cache C0 and a cache C1. The latch L1 and the latch L2 may respectively hold one page of data.

During the read operation, after transmitting the data in sectors S0 to S3 of the cache C0 of the latch L2 to the ECC chip 300, the NAND chip 200A transmits the data of sector S0 to sector S3 of the next page held in the cache C0 of the latch L1 to the cache C0 of the latch L2. After transmitting the data of sectors S4 to S7 of the cache C1 of the latch L2 to the ECC chip 300, the NAND chip 200A transmits the data of the sectors S4 to S7 of the next page held in the cache C1 of the latch L1 to the cache C1 of the latch L2, then holds the data of the next page read from the memory array in the latch L1. The ECC chip 300 performs the same operation as the above-mentioned embodiment.

As described above, according to the present embodiment, the data size (storage capacity) of RAM_E and RAM_O may be reduced by making RAM_E and RAM_O of the ECC chip 300 to alternately hold the data of the even-numbered and odd-numbered sectors, thereby reducing the chip area and cost of the ECC chip 300. Furthermore, by transmitting the read data between the NAND chip 200 and the ECC chip 300 through the DATA terminal dedicated to ECC, the time required for the ECC processing may be shortened.

In addition, the above-described embodiment shows an example in which one page contains eight sectors (one cache contains four sectors), which is merely an example. For example, when one page is 4 KB (one cache is 2 KB), if a sector is 512 bytes, a page contains eight sectors, and if a page is 2 KB, a page may also contain four sectors. Under the circumstances, the ECC chip 300 may also perform ECC processing on a sector-by-sector basis or in units of multiple sectors (during a programming operation, parity data is generated for each sector, and during a read operation, sector errors are detected and corrected based on the parity data).

The preferred embodiments of the present disclosure have been described in detail, but the present disclosure is not limited to the specific embodiments, and various modifications and changes may be made within the scope of the present disclosure described in the claims.

What is claimed is:

1. A semiconductor storage device, comprising:
   a Not AND (NAND) chip, comprising an NAND-type memory array, a control member, and an output member, wherein the control member controls a read operation of a memory array, the output member outputs data read from the memory array to an error checking and correcting (ECC) chip;
   the ECC chip, comprising a first holding portion and a second holding portion, and an ECC member, wherein the ECC member performs error detection and correction of data held in the first holding portion and the second holding portion; and
   when a page comprises n sectors, the output member outputs data to the ECC chip in units of sectors, the first holding portion holds the data of even-numbered sectors, and the second holding portion holds the data of odd-numbered sectors, the ECC member performs the error detection and correction of the data read from the first holding portion or the second holding portion.

2. The semiconductor storage device according to claim 1, wherein,
the first holding portion and the second holding portion are able to hold the data of n/4 sector, respectively,
the output member outputs the data of a sector to the outside in response to the ECC chip, and outputs the data of the n/2th sector from the sector to the ECC chip.

3. The semiconductor storage device according to claim 1, wherein,
the control member reads a next page from the memory array in response to a timing at which the ECC chip outputs data of an initial sector of a page to the outside.

4. The semiconductor storage device according to claim 1, wherein,
the output member comprises: a first dedicated terminal, configured to output data to the ECC chip,
the ECC chip comprises: a second dedicated terminal, configured to receive the data output from the first dedicated terminal.

5. The semiconductor storage device according to claim 4, wherein,
the first dedicated terminal comprises a clock terminal for outputting a clock signal and a data terminal for outputting data, the second dedicated terminal comprises a clock terminal for receiving the clock signal, and a data terminal for inputting the data,
the output member outputs the data from the data terminal in synchronization with the clock signal,
the ECC chip inputs the data from the data terminal in synchronization with the clock signal.

6. The semiconductor storage device according to claim 1, wherein,
the control member comprises: a first latch holding the data read from the memory array; and a second latch holding the data transmitted from the first latch, wherein the first latch holds a page of the data, the second latch holds ½ page of the data,
the output member outputs the first half of the ½ page of data held in the first latch and the second half of the ½ page of data held in the second latch to the ECC chip.

7. The semiconductor storage device according to claim 1, wherein,
under the circumstances where one page comprises eight sectors, and the ECC member performs the error detection and correction of the data in units of sectors, when a time for the output member to output the data of the one sector is set as tDOUT1, a time for the ECC chip to output the data of the one sector to the outside is set as tDOUT2, and a latency from outputting the data of the one sector from the NAND chip to an end of the error detection and correction of the sector is set as tLTCY,
there is a limitation set as tDOUT1+tLTCY<tDOUT2×3.

8. The semiconductor storage device according to claim 1, wherein,
the NAND chip and the ECC chip are accommodated in a package.

9. A reading method, which is a reading method of a semiconductor storage device, wherein the semiconductor storage device comprises an NAND chip, comprising an NAND-type memory array, a control member, and an output member, wherein the control member controls a read operation of a memory array, the output member outputs data read from the memory array to an error checking and correcting (ECC) chip; and the ECC chip, comprising a first holding portion and a second holding portion, and an ECC member, wherein the ECC member performs error detection and correction of data held in the first holding portion and the second holding portion, and
the output member outputs data to the ECC chip in units of sectors,
the first holding portion holds the data of even-numbered sectors, and the second holding portion holds the data of odd-numbered sectors,
the ECC member performs the error detection and correction of the data read from the first holding portion or the second holding portion, and outputs the corrected data to the outside.

10. The reading method according to claim 9, wherein,
the output member outputs the data from a first dedicated terminal to the ECC chip in synchronization with a clock signal,
the ECC chip receives the data from a second dedicated terminal connected to the first dedicated terminal in synchronization with the clock signal.

11. The reading method according to claim 9, wherein,
the first holding portion and the second holding portion are able to hold the data of n/4 sector, respectively,
the output member outputs the data of a sector to the outside in response to the ECC chip, and outputs the data of the n/2th sector from the sector to the ECC chip.

12. The reading method according to claim 9, wherein,
the control member reads a next page from the memory array in response to a timing at which the ECC chip outputs data of an initial sector of a page to the outside.

13. The reading method according to claim 9, wherein,
under the circumstances where one page comprises eight sectors, and the ECC member performs the error detection and correction of the data in units of sectors, when a time for the output member to output the data of the one sector is set as tDOUT1, a time for the ECC chip to output the data of the one sector to the outside is set as tDOUT2, and a latency from outputting the data of the one sector from the NAND chip to an end of the error detection and correction of the sector is set as tLTCY,
there is a limitation set as tDOUT1+tLTCY<tDOUT2×3.

* * * * *